United States Patent

Schacht et al.

[11] Patent Number: 5,849,808
[45] Date of Patent: Dec. 15, 1998

[54] ORGANIC SOLVENT SOLUBLE PHOTORESISTS WHICH ARE DEVELOPABLE IN AQUEOUS ALKALINE SOLUTIONS

[75] Inventors: Hans-Thomas Schacht, Rheinfelden; Norbert Muenzel, Heltersheim, both of Germany

[73] Assignee: Olin Microelectronic Chemicals, Inc., Norwalk, Conn.

[21] Appl. No.: 635,085

[22] Filed: Apr. 19, 1996

[30] Foreign Application Priority Data

Apr. 21, 1995 [CH] Switzerland ............... 01144/95
Jul. 21, 1995 [CH] Switzerland ............... 02157/95

[51] Int. Cl.$^6$ .................. C08J 3/28; C08G 8/24; C08G 8/20
[52] U.S. Cl. .................. 522/31; 522/57; 522/59; 522/120; 528/129; 528/153; 528/230; 525/312
[58] Field of Search .................. 525/193, 312; 522/31, 57, 59, 120; 528/250, 129, 153, 230

[56] References Cited

U.S. PATENT DOCUMENTS

| 332,913 | 7/1885 | Lundberg | 528/250 |
|---|---|---|---|
| 3,964,907 | 6/1976 | Marsh | 522/33 |
| 4,713,441 | 12/1987 | Heller et al. | |
| 5,238,781 | 8/1993 | Schadeli | 522/31 |
| 5,354,643 | 10/1994 | Cabrera et al. | |
| 5,496,678 | 3/1996 | Imai et al. | 522/31 |
| 5,580,695 | 12/1996 | Murata et al. | 522/31 |
| 5,650,259 | 7/1997 | Imai et al. | 522/31 |

FOREIGN PATENT DOCUMENTS

| 447868 | 9/1991 | European Pat. Off. |
|---|---|---|
| 520642 | 12/1992 | European Pat. Off. |
| 588544 | 3/1994 | European Pat. Off. |
| 2746904 | 4/1979 | Germany |

OTHER PUBLICATIONS

Flory, "Principles of Polymer Chemistry", Cornell University Press, Ithaca, New York, p. 361 (1953).
"Hawley's Condensed Chemical Dictionary", 12th ed., Van Nostrand Reinhold Co., New York, p. 325 (1993).

*Primary Examiner*—Donald R. Wilson
*Attorney, Agent, or Firm*—Ohlandt, Greeley, Ruggiero & Perle

[57] ABSTRACT

A polymer which is insoluble in aqueous-alkaline developer solutions, and comprises structural units of the formula (I):

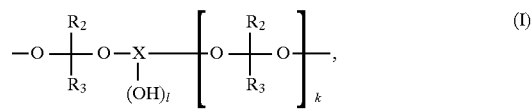

in which $R_2$ is hydrogen, $C_1$–$C_{18}$ alkyl, $C_5$–$C_{10}$ cycloalkyl, $C_5$–$C_{14}$ aryl, $C_6$–$C_{30}$ aralkyl, $R_3$ is $C_1$–$C_{18}$ alkyl, $C_5$–$C_{10}$ cycloalkyl, $C_5$–$C_{14}$ aryl, or $C_6$–$C_{30}$ aralkyl, it being possible for the alkyl, cycloalkyl, aryl, or aralkyl groups to be substituted if desired by one or more hydroxyl groups or nitro groups or by one or more halogen atoms, and X is a k+1 valent organic radical, k being a number from 1 to 5, and l is a number from 0 to 4, in a quantity such that the cleavage products obtained by reaction with an acid are soluble in aqueous-alkaline developer solutions, is suitable as a binder for DUV photoresists of high processing stability, high contrast, and good resolution.

17 Claims, No Drawings

ORGANIC SOLVENT SOLUBLE PHOTORESISTS WHICH ARE DEVELOPABLE IN AQUEOUS ALKALINE SOLUTIONS

BACKGROUND OF THE INVENTION

1. Field of the Invention

The present invention relates to polymers comprising acid-cleavable protecting groups and acid-labile bridges, to a process for the preparation of these polymers to radiation-sensitive compositions comprising these polymers to processes for the production of images using these compositions, and to the use of the compositions as positive resists.

2. Brief Description of Relevant Art

The production of large-scale-integrated circuits currently requires the ability for structures having a width of less than 0.35 μm to be transferred imagewise to the substrate. The resolution capacity, for example of an o-quinone diazide/ novolak system, has reached the limits of the physically possible at a wavelength of 365 nm, which is used for the imagewise exposure. For this reason, there is increasing interest in photoresists which work at shorter wavelengths in the deep UV region (DUV region, deep ultra violet: 190 to 300 nm). Novolaks absorb so strongly in this region that uniform exposure over the usual layer thickness of approximately 1.0 μm is impossible. In order to ensure the requisite optical transparency, poly(p-hydroxystyrene) or derivatives thereof are generally used as binder resins for photoresists working in the DUV region.

Systems of increased radiation sensitivity comprise, for example, alkali-soluble binder resins whose alkali-solubilizing groups, for example hydroxyl groups, have been blocked by acid-mobile protecting groups, thereby rendering the binder resin substantially insoluble in alkali. Exposure then initiates a primary reaction of an acid photogenerator which absorbs at the appropriate wavelength, forming a strong acid which, in the subsequent secondary reaction, results in elimination of the protecting groups and thus in reformation of the solubilizing groups.

An example of such systems is poly(p-hydroxystyrene) whose phenol groups are protected by, for example, tert-butyloxycarbonyloxy (TBOC) or tetrahydropyranyl (THP) groups. Photoresists comprising such binder resins are known (see for example: M. J. Bowden and S. R. Turner (eds.) "Electronic and Photonic Application of Polymers", ACS Series 218, Washington 1988; and N. Hayashi et al., Polymer 33, 1583 (1992)), but have disadvantages as far as adhesion to silicon is concerned.

Moreover, these chemically strengthened positive resists are very sensitive in terms of the process interval between the primary reaction and the subsequent secondary reaction. Extended intervals (post-exposure delay), which become critical after only a few minutes in sensitive systems, result in considerable surface inhibition, leading to the formation of T-shaped denatured profiles (S. A. MacDonald et al., SPIE Vol. 1466, Advances in Resist Technology and Processing VIII (1991) 2–7).

Attempts have been made to improve adhesion, reproducibility and resolution in the resist formulations by using therein a binder resin whose phenolic hydroxyl groups have been replaced only partially by acid-cleavable protecting groups. One example of such attempts is EP-A 447,868, which proposes a radiation-sensitive mixture in which the polymer is protected partially by tetrahydropyranyl groups.

EP-A 520,642 proposes poly(hydroxystyrene) polymers protected partially by acetal or ketal groups, which polymers are said to be likewise devoid of the above-mentioned disadvantages. It is known, however, that copolymers having free phenolic monomer units are subject to an increased occurrence of losses in thermal stability. Thermally induced decomposition (autocatalysis) can be attributed to a partial deprotection which results from the catalytic effect of the weakly acidic, phenolic hydroxyl groups. With the resists known to date this problem has not been solved satisfactorily, especially in the case of highly acid-mobile protecting groups such as the acetal and ketal protecting groups. It is precisely these protecting groups, however, which are preferred, since they permit a relatively long interval between exposure and post-exposure bake (and thus a greater scope in processing) than the less acid-mobile protecting groups, for example the tert-butoxycarbonyloxy (TBOC) group or the tert-butyl ester protecting group.

An important factor for the thermal flow resistance of the relief structures produced is the level of the glass transition temperature ($T_g$) of the binder resin. As the content of protecting groups increases, there is an increase in $T_g$ and consequently in the flow resistance of the resist structures as well. A sufficiently high flow resistance (dimensional stability of the resist structures produced), however, is of fundamental importance for the plasma-chemical structural transfer (etching process) on the semiconductor substrate (TiN, $SiO_2$, Al, and the like) which follows the lithographic process.

There is, therefore, a need for binder resins having a protecting-group content which is as low as possible yet still sufficiently high to ensure the required solubility difference between exposed and unexposed areas.

BRIEF SUMMARY OF THE INVENTION

It has now been found that radiation-sensitive mixtures comprising polymers having specific acid-cleavable acetal or ketal groups in the polymer main chain or as cross-linking bridge member between two or more polymer main chains do not have the above-described disadvantages and are distinguished in particular by very good processing stability, low loss in layer thickness, and a high level of contrast between the exposed and unexposed areas.

The present invention relates to a polymer which is insoluble in aqueous-alkaline developer solutions, and comprises structural units of the formula (I):

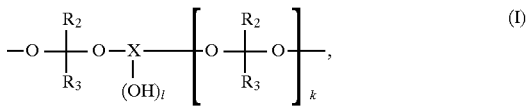

in which $R_2$ is hydrogen, $C_1$–$C_{18}$ alkyl, $C_5$–$C_{10}$ cycloalkyl, $C_5$–$C_{14}$ aryl, $C_6$–$C_{30}$ aralkyl, $R_3$ is $C_1$–$C_{18}$ alkyl, $C_5$–$C_{10}$ cycloalkyl, $C_5$–$C_{14}$ aryl, or $C_6$–$C_{30}$ aralkyl, it being possible for the alkyl, cycloalkyl, aryl, or aralkyl groups to be substituted if desired by one or more hydroxyl groups or nitro groups or by one of more halogen atoms, and X is a k+1 valent organic radical, k being a number from 1 to 5, and 1 is a number from 0 to 4, in a quantity such that the cleavage products obtained by reaction with an acid are soluble in aqueous-alkaline developer solutions.

DETAILED DESCRIPTION OF PREFERRED EMBODIMENTS

The polymers of the invention expediently have a molecular weight $M_w$ of from 1,000 to 1,000,000, preferably from 6,000 to 500,000, particularly preferably from 8,000 to 200,000 and, in particular, from 10,000 to 150,000.

In the formula (I) $R_2$ is preferably methyl or ethyl and $R_3$ is hydrogen.

The 2-6-valent radical X in the bridge members of the formula (I) is derived from organic polyhydroxy compounds. In principle, X can be the radical of any linear, branched, or cyclic polyhydroxy compound having at least 2 hydroxyl groups.

X in the formula (I) is preferably ethylene, isopropylidene, cyclohexylene or the divalent or polyvalent radical of a polyhydroxy compound of the formulae (IIa–IIj) following the removal of two or more OH groups:

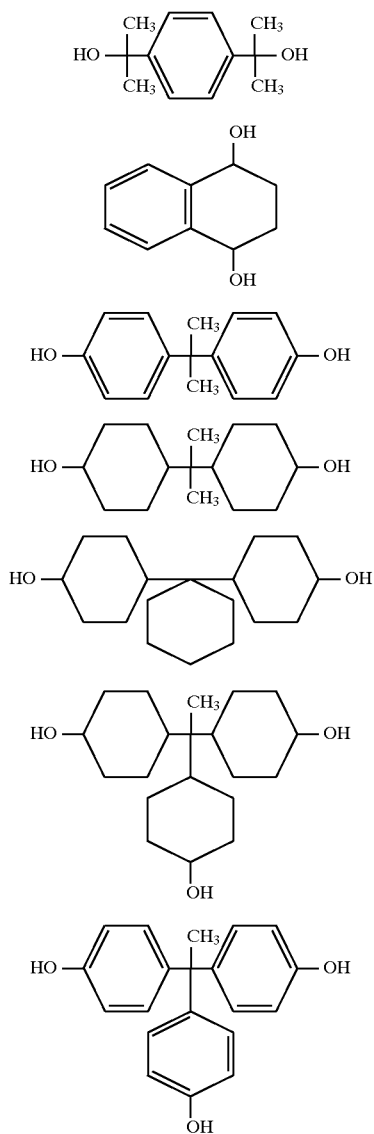

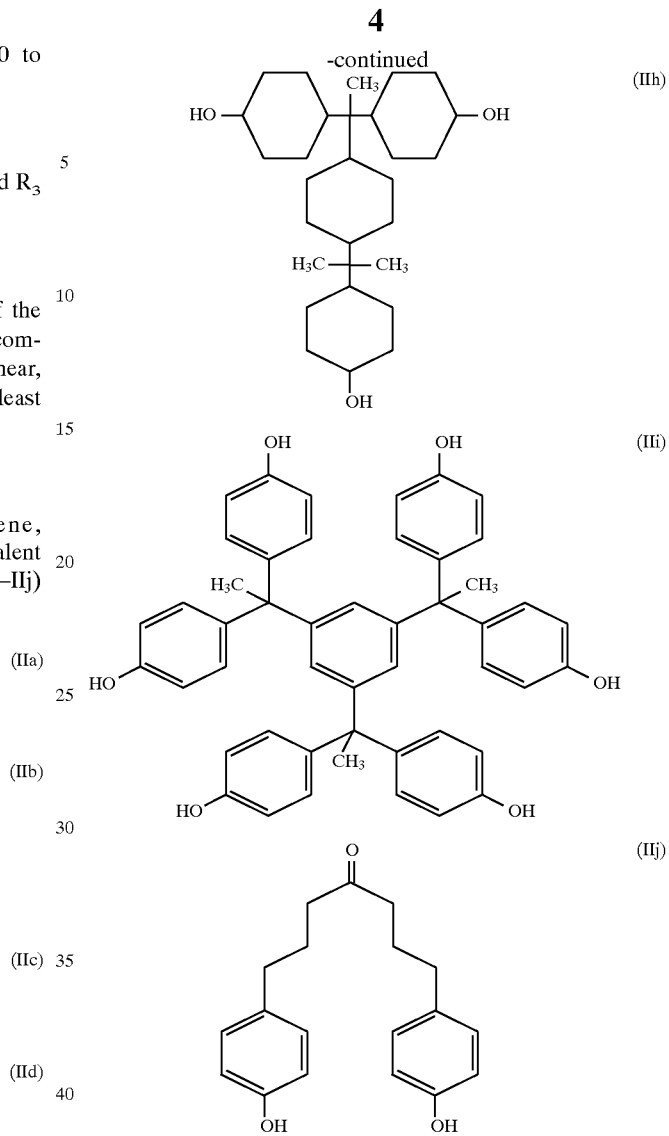

The structural units of the formula (I) are sensitive to acid, i.e., the polymers of the invention are cleaved by the action of acid to form a plurality of OH-terminated cleavage products, and the solubility in alkali is substantially increased.

In the polymers of the invention the structural units of the formula (I) may be constituents of the polymers main chain; however, they may also connect two or more polymer chains as bridge members.

The polymers of the invention are derived from polyhydroxy compounds of the formula (VII)

in which X and k are as defined for formula (I) above.

If such a compound of the formula (VII) or a mixture of two or more such compounds is reacted with an enol ether, polymers having structural units of the formula (I) in the main chain are formed. If only dihydroxy compounds are employed in this context, then linear polymers are produced. The use of compounds of the formula (VII) having three or more OH groups leads to partially cross-linked products, with all or only some of the OH groups of the polyhydroxy compound being able to participate in the polymerization reaction.

If the structural units of the formula (I) are bridge members between two or more polymer main chains, the polymers of the invention preferably comprise COOH groups or phenolic hydroxyl groups, in the side chains, which are completely or partially substituted with acid-labile protecting groups.

Such cross-linked polymers are obtainable by reacting alkali-soluble polymers, comprising hydroxyl or carboxyl groups in the side chain, with enol ethers and polyhydroxy compounds of the formula (VII).

The existence of structures of this type cross-linked via structural units of the formula (I) can be demonstrated, for example, by $^{13}$C-NMR spectroscopy.

Examples of alkali-soluble polymers suitable for preparing polymers of the invention are polyhydroxystyrene, hydrogenated polyhydroxystyrene, novolak resins, hydrogenated novolak resins, halo-or alkyl-substituted polyhydroxystyrene, hydroxystyrene/maleimide copolymers, styrene/maleic anhydride copolymers, and acrylic acid and methacrylic acid copolymers.

Preferred alkali-soluble polymers are phenolic resins, such as polyhydroxystyrene, hydrogenated polyhydroxystyrene, hydroxystyrene copolymers and novolaks.

Preferably, only some of the OH groups of the alkali-soluble polymers are replaced by acid-cleavable protecting groups or bridge members of the formula (I); in other words, the preferred polymers of the invention comprise COOH groups or phenolic hydroxyl groups.

Examples of suitable acid-cleavable protecting groups are silyl ether, cumyl ester, tetrahydropyranyl ether, tetrahydropyranyl ester, enol ether, enol ester, tert-alkyl ether, tert-alkyl ester, tert-alkyl carbonate, for example tert-butoxycarbonyloxy (t-BOC), acetal and ketal groups.

The polymers of the invention preferably comprise as acid-cleavable protecting group a group of the formula (II)

in which $R_2$ and $R_3$ are as defined for formula (I) and $R_1$ is $C_1$–$C_{18}$ alkyl, $C_5$–$C_{10}$ cycloalkyl, $C_5$–$C_{14}$ aryl or $C_6$–$C_{30}$ aralkyl, it being possible for the alkyl, cycloalkyl, aryl, or aralkyl groups to be substituted if desired by one or more hydroxyl groups or nitro groups or by one or more halogen atoms.

Both the number of protecting groups and the number of bridge members can be varied within wide ranges.

The polymers of the invention preferably have a protecting-group content S=m/(m+n) of from 0.05 to 0.95, in particular from 0.10 to 0.50, and a degree of cross-linking V=o/(m+n+o) of from 0.001 to 0.5, in particular from 0.002 to 0.2, m being the number of acid-cleavable protecting groups, n being the sum of the number of COOH groups and the number of phenolic hydroxyl groups, and o being the number of bridge members of the formula (I).

Preference is also given to polymers comprising structural repeating units of the formulae (III), IV, and V:

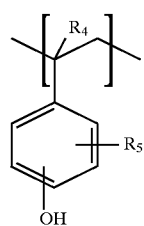

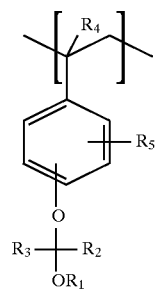

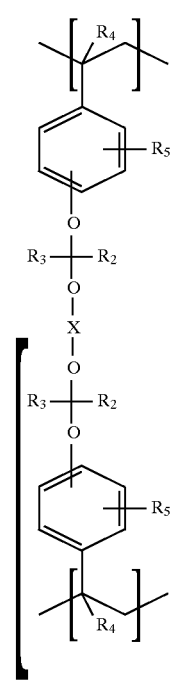

in which $R_1$, $R_2$, $R_3$, k, and X are as defined above, $R_4$ is hydrogen, methyl or halogen and $R_5$ is hydrogen, $C_1$–$C_6$ alkyl, $C_1$–$C_6$ alkoxy or halogen.

Particular preference is given to polymers comprising structural repeating units of the formulae (IIIa), (IVa), and (Va):

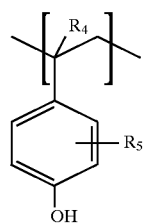

-continued

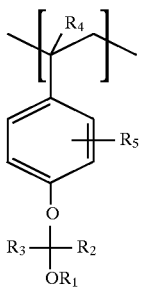
(IVa)

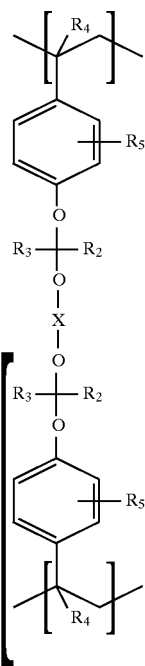
(Va)

in which $R_1$, $R_2$, $R_3$, k and X are as defined above, $R_4$ is hydrogen, methyl or halogen and $R_5$ is hydrogen, $C_1$–$C_6$ alkyl, $C_1$–$C_6$ alkoxy or halogen.

Alkyl group substituents $R_1$ to $R_3$ or $R_5$ can be linear or branched. Examples are methyl, ethyl, n-propyl, isopropyl, n-butyl, sec-butyl, isobutyl, tert-butyl, n-pentyl, neo-pentyl, isopentyl, n-hexyl, and isohexyl.

Examples of cycloalkyl groups $R_1$, $R_2$, or $R_3$ are cyclopentyl, cyclohexyl, cycloheptyl, and cyclooctyl.

Examples of aryl groups are phenyl, tolyl, mesityl, naphthyl, and anthryl.

Aralkyl groups are preferably benzyl or phenylethyl.

Examples of alkoxy substituents are methoxy, ethoxy, n-propoxy, iso-propoxy, n-butoxy, and tert-butoxy.

Halogen atom substituents $R_4$ or $R_5$ are preferably chlorine, fluorine, or bromine, especially chlorine.

In the protecting groups of the formula (II) $R_1$ is preferably methyl, ethyl, n-propyl, isopropyl, n-butyl, isobutyl, tert-butyl, or cyclohexyl.

In the protecting groups of the formula (II) and the bridge members of the formula (I) $R_2$ is preferably methyl or ethyl, and $R_3$ is preferably hydrogen.

$R_4$ and $R_5$ in the structural units of the formulae (III), (IV), and (V) are preferably hydrogen.

In a further preferred embodiment, the structural units of the formula (I) form constituents of the polymer main chain.

The invention additionally relates to a process for the preparation of a polymer of the invention by reacting an alkali-soluble polymer with a vinyl ether of the formula (VI):

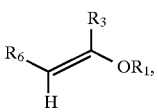
(VI)

in which $R_1$ and $R_3$ are as defined for formula (II) and $R_6$ is hydrogen, $C_1$–$C_{17}$ alkyl, $C_5$–$C_{10}$ cycloalkyl, $C_5$–$C_{14}$ aryl or $C_6$–$C_{30}$ aralkyl, with a polyhydroxy compound of the formula (VII):

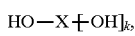
$$HO-X+OH]_k,\quad (VII)$$

in which X and k are as defined for formula (I).

The reaction is preferably carried out in the presence of an appropriate, usually acidic catalyst. Examples of suitable such catalysts are acidic ionic exchanger resins, acids, for example sulfonic acids, or salts thereof, for example pyridinium tosylate.

Suitable starting polymers for the preparation of the polymers of the invention are in principle all alkali-soluble polymers having hydroxyl groups, for example phenol or cresol novolaks or poly[hydroxystyrene].

Particular preference is given to poly[4-hydroxystyrene] as starting polymer.

The vinyl ethers of the formula (VI) are known and some are commercially available. Examples of suitable vinyl ethers are methyl vinyl ether, ethyl vinyl ether, n-butyl vinyl ether, tert-butyl vinyl ether, cyclohexyl vinyl ether, isopropyl vinyl ether, 2-methoxypropene, 2-tert-butoxypropene, and 2-methoxy-2-butene.

The polyhydroxy compounds of the formula (VII) may comprise monomeric or polymeric compounds having at least two OH groups.

Examples of suitable polyhydroxy compounds of the formula VII are diols, such as ethylene glycol, propylene glycol, diethylene glycol, triethylene glycol, polyethylene glycol, polypropylene glycol, bisphenol A, bisphenol F, bisphenol S, hydrogenated bisphenol A, hydrogenated bisphenol F, hydrogenated bisphenol S, tetrabromobisphenol A, 1,4-dihydroxy-naphthalene, 1,4-dihydroxy-1,2,3,4-tetrahydro-naphthalene or 1,4-bis(2-hydroxyprop-2-yl)benzene.

It is, of course, also possible to employ compounds having 3, 4, 5, 6, or more OH groups, for example the compounds indicated in DE-A 44 10 441.

Carbohydrates are also suitable compounds for preparing the cross-linked polymers of the invention, it being possible to employ both monosaccharides and oligo- and polysaccharides. Examples of such polyhydroxy compounds are erythrose, threose, ribose, arabinose, xylose, lyxose, fructose, glucose, mannose, galactose, allose, altrose, gulose, idose, and talose.

The invention relates furthermore to a process for the preparation of a polymer in which the structural units of the formula (I) are constituents of the polymer main chain, by reacting a polymer comprising COOH groups or phenolic hydroxyl groups in the side chains with a vinyl ether of the formula (VI):

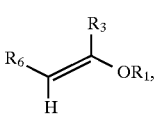
(VI)

in which $R_1$ and $R_3$ are as defined for formula (II) above and $R_6$ is hydrogen, $C_1$–$C_{17}$ alkyl, $C_5$–$C_{10}$ cycloalkyl, $C_5$–$C_{14}$ aryl or $C_6$–$C_{30}$ aralkyl, and with a polyhydroxy compound of the formula (VII):

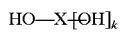 (VII), in which X and k are as defined for formula (I) above.

As indicated at the outset, the polymers according to the invention are employed in positive resist formulations for electronics (electroplating resists, etch resists, and solder resists), in chemical milling, for the production of printing plates, such as offset printing plates or screen printing plates, and printed circuits and, in particular, in microelectronics, for the production of integrated circuits.

The invention thus also relates to a radiation-sensitive composition comprising, based on the overall quantity of components A and B, (A) 70.0–99.9% by weight, preferably 90–99.8% by weight, of a polymer of the invention and (B) 0.1–30.0% by weight, preferably 0.2–10% by weight, of a substance which forms an acid on exposure to actinic radiation.

The polymers of component (A) contain protecting groups which are eliminated under acid catalysis, so that the solubility of the mixture in an aqueous-alkaline solution is increased. The presence of structures cross-linked via the bridge members of the formula (I), which structures are likewise cleaved by the action of acid, brings about a particularly high solubility difference between the exposed and unexposed areas and, therefore, a very high level of contrast.

Surprisingly, the resist compositions of the invention exhibit a very high resolution despite the high molecular weight of the binder polymers. Furthermore, these mixtures are distinguished in particular by good processing stability, little loss in layer thickness in the unexposed areas, and high thermal dimensional stability of the relief structures produced.

The radiation-sensitive components B which form or give off acids on exposure to actinic radiation can be any of a large number of known compounds. These include, for example, diazonium salts as used in the diazotype process, o-quinone diazides, as used in known positive-working copying compositions, or else halogen compounds which form hydrohalic acid under irradiation. Compounds of this type are described, for example, in U.S. Pat. Nos. 3,515,552; 3,536,489; or 3,779,778 and in DE-A 27 18 259; 22 43 621; or 26 10 842.

Suitable radiation-sensitive components B of the composition according to the invention are, in particular, cationic photoinitiators from the group consisting of the so-called onium salts, for example iodonium or sulfonium salts. Such compounds are described, for example, in "UV-Curing, Science, and Technology" (Editor: S. P. Pappas, Technology Marketing Corp., 642 Westover Road, Stamford, Connecticut, USA).

It is also possible to use sulfoxonium salts as radiation-sensitive compounds. Such salts are described, for example, in EP-B 35,969 or in EP-A 44,274 and 54,509. Particular mention should be made of aliphatic sulfoxonium salts which absorb in the deep UV region.

It is also possible to employ sulfonic esters as described, for example, in U.S. Pat. No. 5,118,582; U.S. Pat. No. 5,189,402; and in T. Üno et al., Polym. Eng. Sci. 32, 1511 (1992). Also suitable are other sulfonic esters, for example N-sulfonyloxyimides, as described in EP-A 502,677, and nitrobenzyl sulfonates, as described in U.S. Pat. No. 5,135, 838. Other sulfonyl compounds which can be used are described in, for example, DE-A 42 25 422 and in Polym. Eng. Sci. 32, 1476 (1992).

For irradiation with short-wave UV rays or electron beams, particular preference is given to disulfone compounds, for example phenyl cumyl disulfone and phenyl 4-anisyl disulfone, as described in DE 38 04 316.

Suitability additionally extends, in particular, to imino sulfates as described, for example, in EP-A 241,423 and EP-A 571,330.

It is also possible to employ compounds which liberate sulfonic acids on irradiation with actinic light. Such compounds are known per se and are described, for example, in GB-A 2,120,263, in EP-A 84,515; 37,152; or 58,638; and in U.S. Pat. Nos. 4,258,121 or 4,371,605. Compounds which liberate carboxylic acid on irradiation can likewise be used. Examples of such compounds are described in EP-A 552, 548.

If the radiation-sensitive acid-eliminating components B employed are salts, they are preferably soluble in organic solvents. With particular preference these salts are products with complex acids such as, for example, tetrafluoroboric acid, hexafluorophosphoric acid, trifluoromethanesulfonic acid, hexafluoroarsenic acid, or hexafluoroantimonic acid.

As component B, the compositions of the invention preferably comprise an onium salt, a disulfo compound or a nitrobenzyl sulfonate.

Preference extends to radiation-sensitive compositions comprising not only components A and B but also an organic solvent as component C.

The choice of organic solvent for component C and its concentration depend principally on the nature of the composition of the resist formulation and on the coating process. The solvent should be inert, i.e., it should not undergo any chemical reaction with components A and B, and it should be removable again on drying after coating. Examples of suitable solvents are ketones, ethers, esters and aromatic compounds, and any desired mixtures thereof. Examples of these are methyl ethyl ketone, isobutyl methyl ketone, methyl amyl ketone, methyl isoamyl ketone, cyclopentanone, cyclohexanone, N-methylpyrrolidone, dioxane, tetrahydrofuran, 2-methoxyethanol, and 2-ethoxyethanol; acetates, such as butyl acetate; and 1-methoxy-2-propanol, 1,2-dimethoxyethane, diethylene glycol dimethyl ether, butylglycol, alkylene glycol monoalkyl ethers, for example ethylcellosolve, ethylene glycol monobutyl ether and methylcellosolve; alkylene glycol alkyl ether esters, such as methylcellosolve acetate, ethylcellosolve acetate, propylene glycol ethyl ether acetate, propylene glycol methyl ether propionate, and methoxypropyl acetate; and ethyl acetate, n-butyl acetate, ethyl 3-ethoxypropionate and methoxymethyl propionate, ethyl lactate, toluene and xylenes. Preferred organic solvents are ethyl lactate, ethoxyethyl propionate and, in particular, methoxypropyl acetate.

Preference is likewise given to compositions comprising, based on the overall quantity of components A and B, from 0.01 to 40% by weight of customary additives in addition as component D.

These customary additives are, for example, the following substances:

Pigments or dyes in quantities of from about 0.1 to 2% by weight, based on the overall quantity of components A and B, for instance Mikrolith Blau 4G, Orasolblau GN, and Irgalithgrün;

organic and inorganic fillers in quantities of from about 5 to 15% by weight, based on the overall quantity of components A and B, such as talc, quartz ($SiO_2$), barium sulfate ($BaSO_4$), aluminum oxide and calcium carbonates, with which it is possible for example to enhance the properties of a coating, such as heat resistance, adhesion or scratch resistance;

weakly basic additives (paint additives) in an overall quantity of from about 0.01 to 10% by weight, based on the overall quantity of components A and B, such as antifoams (for example Byk 80), adhesion promoters (for example benzotriazole), fungicides and thixotropic agents or hydroxy-terminated poly glycol ethers containing ethylene oxide and/or propylene oxide units, such as, for example, Tetronic 701, 901, 908P, and 1501 (BASF products);

surfactants for improving the wettability of the composition, for preventing streaking on the resulting film, for improving the developability of the irradiated area, etc. The surfactants include nonionic surfactants, for example polyoxyethylene lauryl ether, polyoxyethylene stearyl ether, polyoxyethylene oleyl ether, polyoxyethylene octyphenol ether, polyoxyethylene nonylphenol ether, polyoxyethylene glycol dilaurate, and polyethylene glycol distearate; fluorinated surfactants, for example F Top EF 301, EF 303, and EF 352 (products of Shin Akita Kasei K. K.), Megafac F 171 and F 173 (products of Dainippon INK & Chemicals), Fluorad FC 430 and FC 431 (products of Sumitomo 3M Limited), Asahi Guard AG 710, Surflon S-382, Surflon SC 101, SC 102, SC 103, SC 104, SC 105, and SC 106 (products of Asahi Glass Co., Ltd.). Use is also made, for example, of the organosiloxane polymer KP 341 (product of Shin-Etsu Chemical Co., Ltd.) and Polyflow No. 75 and No. 95 (products of Kyoeisha Yushikagaku Kogyo K. K.), which are acrylic or methacrylic acid polymers. The quantity of surfactant used is about 0.01–0.1% by weight, based on the overall quantity of components A and B;

highly basic additives, such as aromatic or aliphatic amines, ammonium salts, or N-containing heterocyclic compounds, usually in a concentration of from 0.01 to 1% by weight, based on the overall quantity of components A and B; examples of such basic additives are 2-methylimidazole, triisopropylamine, 4-dimethylaminopyridine, and 4,4'-diaminodiphenyl ether.

It is preferred to use an N-containing heterocyclic compound or an aromatic amine as component D.

The resist formulations of the invention are prepared, for example, by mixing components A, B and, if used, C and D with stirring at room temperature to give a homogeneous solution.

The resist formulation is applied uniformly to the substrate at room temperature by known coating methods, for example by dipping, knife coating, brushing, spraying, especially electrostatic spraying, and reverse roll coating, and in particular by spin coating.

The application rate (layer thickness) and the substrate type (layer support) are dependent on the desired area of application. The layer-thickness range generally covers values from 0.1 to more than 10 $\mu$m, preferably from 0.2 to 2.0 $\mu$m.

In microelectronics the substrate is, for example, a surface-oxidized silicon wafer.

After coating, the solvent is generally removed by drying, for example at temperatures between 70° and 130° C.

The resist film is a photoresist which, after drying, has a high sensitivity on exposure to actinic radiation and very good adhesion to the substrate. Furthermore, it has high transparency and sensitivity even in the deep UV region, especially at 250 nm, and has good thermal stability.

In order to produce relief structures, the substrate coated with the composition of the invention is subjected to imagewise exposure. The term "imagewise" exposure covers both exposure through a photomask containing a predetermined pattern, for example a transparency, and exposure with a laser beam, which is moved over the surface of the coated substrate, for example under computer control, and in this way generates an image, irradiation with computer-controlled electron beams, and exposure to X-rays or UV radiation through a corresponding mask.

In general, exposure is carried out using UV and/or VIS radiation, preferably having a wavelength between about 190 and 1,000 nm, in particular from 190 to 300 nm, and especially between 245 and 250 nm. Irradiation can in principle be carried out using all known radiation sources, for example high-pressure mercury lamps or UV/VIS lasers and, in particular, excimer lasers (KrF excimer laser light having a wavelength of 248 nm). The radiation source can also be X-rays (for example synchrotron radiation) or beams of charged particles (for example electron beams), inter alia. The process parameters, for example the period of irradiation and the distance of the radiation source from the radiation-sensitive layer, generally depend on the nature of the radiation-sensitive composition and on the desired properties of the coating, and can be determined by the person skilled in the art using a few routine experiments.

Following imagewise exposure, the wafer is heated, if desired, at 50° to 150° C. for a few seconds to a few minutes (post-exposure bake).

The exposed areas of the photoresist are subsequently removed by dissolution in a developer. The choice of particular developer depends on the type of photoresist, in particular on the nature of the binder used or of the photolysis products formed. The developer can comprise aqueous solutions of bases to which, if desired, wetting agents and organic solvents or mixtures thereof are added.

The compositions according to the invention are preferably used as positive resists. The invention, therefore, additionally relates to a process for the production of positive images which comprises the following process measures:

(I.) coating of a substrate with a radiation-sensitive composition comprising, based on the overall quantity of components A and B,
  (A) from 70 to 99.9% by weight of a polymer according to the invention and
  (B) from 0.1 to 30% by weight of a substance which forms an acid on exposure to actinic radiation,
(II.) exposure of the coated substrate to actinic radiation in a predetermined pattern, and
(III). development of the exposed substrate with a developer for positive-working resists.

Particularly preferred developers are aqueous-alkaline solutions as are also employed for the development of o-quinone diazide/novolak resist coatings. These include, for example, aqueous solutions of alkali metal silicates, phosphates, hydroxides and carbonates, in particular tetraalkylammonium hydroxide solutions, for example tetramethylammonium hydroxide solutions. If desired, minor amounts of wetting agents and/or organic solvents can be added to these solutions. Typical organic solvents which can be added to the developer liquids are, for example, cyclohexanone, 2-ethoxyethanol, acetone, isopropanol, ethanol, and mixtures of two or more of these solvents.

The developer is preferably applied by immersing the coated substrate, which has been subjected to imagewise exposure, into the developer solution, by spraying on the developer solution or by repeated application of the developer to the coated substrate, which has been subjected to imagewise exposure, and removal of the developer by spinning.

The invention additionally relates to the use of the compositions of the invention as positive resists for the production of printing plates, printed circuits or integrated circuits, and to the printing plates, printed circuits or integrated circuits produced using the compositions according to the invention.

The present invention is further illustrated by the following Examples. All parts and percentages are by weight and all temperatures are degrees Celsius unless explicitly stated otherwise.

EXAMPLES

Synthesis Example 1: Polymer prepared from poly[4-hydroxystyrene], ethylene glycol, and tert-butyl vinyl ether, having a hydroxyl group content of 80%.

3.75 g of tert-butyl vinyl ether in 17 ml of tetrahydrofuran are added slowly dropwise at 10° C. to a solution of 9.6 g of poly-4-hydroxystyrene ($M_w$=8300, $M_w/M_n$=1.15), 0.4 g of diethylene glycol and a catalytic amount of 4-toluenesulfonic acid in 90 ml of THF (tetrahydrofuran). The reaction mixture is subsequently stirred at room temperature for 5 h. The polymer is then precipitated by introducing the reaction solution into a water/isopropanol mixture. 9.3 g of a white powder are obtained which has the following properties:

Thermogravimetric analysis TGA (10° C./min.):

Difference D (weight loss in the region below 320° C.; onset at 155° C., peak at 194° C.):

D=13.5% by weight;

DSC (10° C./min.): $T_g$=113° C.;

GPC (polystyrene calibration): $M_w$=16,000, $M_w/M_n$=2

Synthesis Example 2: Polymer prepared from poly[4-hydroxystyrene], 1,3-dihydroxy-1,2,3,4-tetrahydronaphthalene and tert-butyl vinyl ether, having a hydroxy group content of 63%. 28.8 g of poly-4-hydroxystyrene ($M_w$=8,300, $M_w/M_n$=1.15), 1.2 g of 1,4-dihydroxy-1,2,3,4-tetrahydronaphthalene and 11.25 g of tert-butyl vinyl ether are reacted in analogy to Synthesis Example 1. 30.5 g of a polymer are obtained which has the following properties:

Thermogravimetric analysis TGA (10° C./min.):

Difference D (in the region below 280° C.; onset at 159° C., peak at 204° C.): D=23.8% by weight;

GPC (polystyrene calibration): $M_w$=26,000, $M_w/M_n$=3

Synthesis Example 3: Polymer prepared from poly[4-hydroxystyrene], 4,4'-isopropylidene-dicyclohexanol and tert-butyl vinyl ether, having a hydroxyl group content of 54%. 3.75 g of tert-butyl vinyl ether in 40 ml of dioxane are added slowly dropwise at 10° C. to a solution of 19.6 g of poly-4-hydroxystyrene ($M_w$=2,400, $M_w/M_n$=1.1), 0.4 g of 4,4'-isopropylidenedicyclohexanol and a catalytic quantity of 4-toluenesulfonic acid in 200 ml of 1,4-dioxane. The reaction mixture is subsequently stirred at room temperature for 5 h. The polymer is then precipitated by introducing the reaction solution into water. 17.8 g of a colorless powder are obtained which has the following properties:

Thermogravimetric analysis TGA (10° C./min.):

Difference D (in the region below 320° C.; onset at 165° C., peak at 210° C.): D=23.5% by weight;

DSC (10° C./min): $T_g$=116° C.

GPC (polystyrene calibration): $M_w$=12,000, $M_w/M_n$=3

The $^{13}$C-NMR spectrum shows a ratio of phenolic OH groups to protecting groups of the formula (II) to bridge members of the formula (I) of 54:40:6.

Synthesis Example 4: Polymer-analogous reaction with di-tert-butyl dicarbonate 6 g of potassium carbonate are added to a solution of 8.0 g of the polymer from Synthesis Example 3 in 40 ml of THF. At 0° C., 1 g of di-tert-butyl dicarbonate is added and the mixture is heated slowly to room temperature. The reaction mixture is subsequently stirred for 3 h. the polymer is then precipitated by introducing the reaction solution into a water/isopropanol mixture. The polymer is filtered off, washed with a water/isopropanol mixture and then dried under reduced pressure to constant weight. 7.5 g of a colorless powder are obtained which has the following properties:

GPC (polystyrene calibration): $M_w$=15,000, $M_w/M_n$=2

The $^{13}$C-NMR spectrum shows a ratio of t-BOC protecting groups: protecting groups of the formula (II): bridge members of the formula (I) of 55:39:6.

Synthesis Example 5: Polymer prepared from poly[4-hydroxystyrene], poly[4-vinylcyclohexanol] and tert-butyl vinyl ether, having a hydroxyl group content of 66%. 7.5 g of tert-butyl vinyl ether in 35 ml of tetrahydrofuran are added slowly dropwise at 10° C. to a solution of 19.7 g of poly-4-hydroxystyrene ($M_w$=5,200, $M_w/M_n$=1.12), 0.3 g of poly[4-vinylcyclohexanol] and a catalytic amount of 4-toluenesulfonic acid in 200 ml of tetrahydrofuran. The reaction mixture is subsequently stirred at room temperature for 3 h. The polymer is then precipitated by introducing the reaction solution into a water/isopropanol mixture. 21.3 g of a white powder are obtained which has the following properties:

Thermogravimetric analysis TGA (10° C./min.):

Difference D (in the region below 320° C.; onset at 155° C., peak at 216° C.): D=22.25% by weight;

GPC (polystyrene calibration): $M_w$=21,000, $M_w/M_n$=3

Synthesis Example 6: Polymer prepared from the hexahydroxy compound of the formula (Iii):

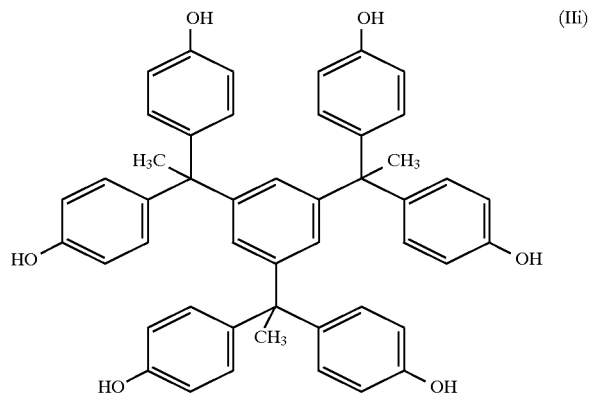

4,4'-isopropylidenedicyclohexanol and t-butyl vinyl ether.

A solution of 5 g of the hexahydroxy compound of the formula (Iii), 5 g of 4,4'-isopropylidenedicyclohexanol, 5.6 g of tert-butyl vinyl ether and a catalytic quantity of 4-toluenesulfonic acid in 90 ml of tetrahydrofuran is stirred at room temperature for 16 hours. After introducing the reaction solution into water, the product is filtered and washed with water. Drying gives 10.4 g of a colorless powder which has the following properties:

Thermogravimetric analysis TGA (10° C./min.):

Difference D1 (onset at 165° C., peak at 211° C.):
D1=16.1% by weight
Difference D2 (in the region below 320° C.; onset at 224° C., peak at 282° C.): D2=37.8% by weight
GPC (polystyrene calibration): $M_w$=5,000,
$M_w/M_n$=3
The $^{13}$C-NMR spectrum shows a ratio of phenolic OH groups:protecting groups of the formula (II):bridge members of the formula (I) of 52:23:25.

Synthesis Example 7: Polymer prepared from 1,1,1-tris (4-hydroxyphenyl)ethane, D(+)-glucose, 4,4'-isopropylidenedicyclohexanol and tert-butyl vinyl ether. A solution of 4 g 1,1,1-tris(4-hydroxyphenyl)ethane, 4 g of 4,4'-isopropylidenedicyclohexanol, 4 g D(+)-glucose, 5 g of t-butyl vinyl ether and a catalytic quantity of 4-toluenesulfonic acid in 105 ml of tetrahydrofuran is stirred at room temperature for 24 hours. The reaction solution is subsequently introduced into water. The product is filtered off and washed with water. Drying gives 10.9 g of a colorless powder. The molecular weight is determined by GPC (polystyrene calibration) and indicates an average molecular weight of 16,000 with a polydispersity of 8.

Synthesis Example 8: Polymer prepared from 2,7-napthalenediol, D(+)-glucose, 4,4'-isopropylidenedicyclohexanol, and tert-butyl vinyl ether. A solution of 4 g of 2,7-naphthalenediol, 4 g of 4,4'-isopropylidenedicyclohexanol, 4 g D(+)-glucose, 6 g of t-butyl vinyl ether and a catalytic quantity of 4-toluenesulfonic acid in 105 ml of tetrahydrofuran is stirred at room temperature for 24 hours. Working up is as described above. Drying gives 11.8 g of polymer. The molecular weight is determined by GPC (polystyrene calibration) and indicates an average molecular weight of 8,000 with a polydispersity of 5.

Synthesis Example 9: Polymer prepared from poly(4-hydroxystyrene), 4,4'-isopropylidenedicyclohexanol and tert-butyl vinyl ether, with a hydroxyl group content of 66%. A catalytic quantity of hydrogen chloride dissolved in 3 g of THF is added at room temperature to a solution of 10.00 g of poly-4-hydroxystyrene ($M_w$=8,500, $M_w/M_n$=1.2), 0.20 g of 4,4'-isopropylidenedicyclohexanol and 3.13 g of tert-butyl vinyl ether in 41 g of THF (tetrahydrofuran). The reaction mixture is subsequently stirred at room temperature for 14 hours. The polymer is then precipitated by introducing the reaction solution into water. The product is filtered and washed with water. Drying under a high vacuum gives 11.46 g of a colorless powder which has the following properties:

Thermogravimetric analysis TGA (10° C./min. in the region below 280° C.):
Difference D (onset at 162° C., peak at 208° C.):
D=31.3% by weight;
GPC (polystyrene calibration): $M_w$=25,000,
$M_w/M_n$=2
DSC (10° C./min.): $T_g$=125° C.
$^{13}$C-NMR: 34% of the hydroxyl groups are protected.

Synthesis Example 10: Polymer prepared from poly(4-hydroxystyrene), 4,4'-isopropylidenedicyclohexanol and tert-butyl vinyl ether, with a hydroxyl group content of 61%. A catalytic quantity of p-toluenesulfonic acid in 17 ml of THF is added at 10° C. to a solution of 19.20 g of poly-4-hydroxystyrene ($M_w$=7,900, $M_w/M_n$=1.5), 0.80 g of 4,4'-isopropylidenedicyclohexanol and 3.75 g of tert-butyl vinyl ether in 90 ml of THF. The reaction mixture is stirred at room temperature for 4 h. The polymer is then precipitated by introducing the reaction solution into water/isopropanol (9:1). The product is filtered and washed with water. Drying under a high vacuum gives 21.60 g of a colorless powder which has the following properties:

Thermogravimetric analysis TGA (10° C./min. in the region below 280° C.):
Difference D (onset at 165° C., peak at 213° C.):
D=31.3% by weight;
GPC (polystyrene calibration): $M_w$=47,000,
$M_w/M_n$=12
DSC (10° C./min.): $T_g$=129° C.
$^{13}$C-NMR: 39% of the hydroxyl groups are protected.

Synthesis Example 11: Polymer prepared from the hexahydroxy compound of the formula (IIi):

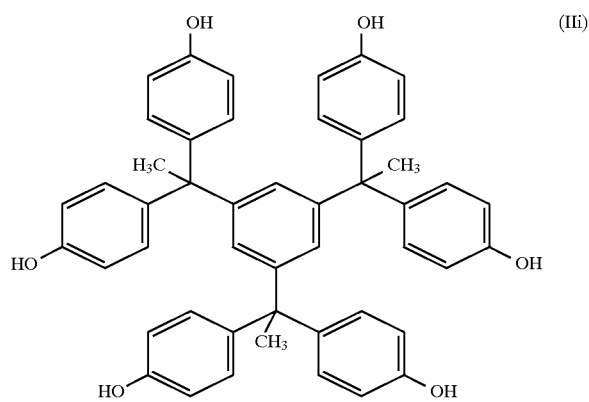

poly(4-hydroxystyrene), 4,4'-isopropylidenedicyclohexanol and tert-butyl vinyl ether, with a hydroxyl group content of 70%. A catalytic quantity of p-toluenesulfonic acid in 34 ml of THF is added at 10° C. to a solution of 16.00 g of poly-4-hydroxystyrene ($M_w$=4,800, $M_w/M_n$=1.3), 1.00 g of 4,4'-isopropylidenedicyclohexanol, 3.00 g of a hexahydroxy compound of the formula (IIi) and 6.56 g of tert-butyl vinyl ether in 180 ml of THF. After 30 minutes the reaction mixture is heated slowly to room temperature and then stirred at room temperature for 3.5 hours. The polymer is subsequently precipitated by introducing the reaction solution into water. The product is filtered and washed with water. Drying gives 20.8 g of a colorless powder which has the following properties:

Thermogravimetric analysis TGA (10° C./min. in the region below 280° C.):
Difference D (onset at 160° C., peak at 214° C.):
D=25.6% by weight;
GPC (polystyrene calibration): $M_w$=49,000,
$M_w/M_n$=7
DSC (10° C./min.): $T_g$=129° C.
$^{13}$C-NMR: 30% of the hydroxyl groups are protected.

Synthesis Example 12: Polymer prepared from poly(4-hydroxystyrene), 4,4'-isopropylidenedicyclohexanol and ethyl vinyl ether, with a hydroxyl group content of 67%.

A catalytic quanity of 4-toluene sulfonic acid dissolved in 5 g THF (tetrahydrofuran) is added at room temperature to a solution of 50 g poly-4-hydroxystyrene ($M_w$=8300, $M_w/M_n$=1.2), of 2.55 g 4,4'-isopropylidenedicyclohexanol and 12.0 g of ethyl vinyl ether in 205 g THF (tetrahydrofuran). The reaction mixture is subsequently stirred at room temperature for 24 hours. The polymer is then precipitated by introducing the reaction solution into water. The product is filtered and washed with water. Drying and a high vacuum gives 59.1 g of a colorless powder which has the following properties:

Thermogravimetric analysis TGS (10° C.min. in the region below 30° C.):
Difference D (at 214° C., peak at 260° C.):
D=25.2% by weight;
GPC (polystyrene calibration): $M_w$=44,000,
$M_w/M_n$=4
DSC (10° C./min.): $T_g$=126° C.
$^{13}$C-NMR: 33% of the hydroxyl groups are protected.

Application Example 1:

96.85 parts by weight of the polymer prepared in Synthesis Example 3 (protecting-group content: 25%, $M_w$=21,000, $M_w/M_n$=7), 3.0 parts by weight of anisyl phenyl disulfone and 0.15 part by weight of 4,4'-diaminodiphenyl ether are dissolved in 1-methoxy-2-propyl acetate (20.0% solids content). The photoresist solution is filtered through a Teflon membrane filter having a pore size of 0.2 μm and is spin-coated onto a silicon wafer in such a way that after drying at 130° C. for 60 seconds on a hotplate, a film having a thickness of 0.82 μm is obtained.

Exposure is carried out on a 5:1 projection exposure unit (Canon FPA 4500, NA=0.37) with KrF excimer laser radiation (248 nm) in 1 mJcm$^2$ steps. Drying of the wafer is then completed on the hotplate for 60 seconds and the wafer is developed for 60 seconds in a 0.262N tetramethylammonium hydroxide solution customarily used for this process. At an exposure dose of 20 mJ/cm$^2$, accurately reproduced positive subsemimicron structures having vertical profiles are obtained, with 0.35 μm lines being resolved.

Application Example 2:

94.6 parts by weight of the polymer prepared in Synthesis Example 7 ($M_w$=18,000, $M_w/M_n$=7), 5.0 parts by weight of triphenylsulfonium triflate and 0.4 part by weight of 4,4'-diaminodiphenyl ether are dissolved in methyl 3-methoxypropionate (19.0% solids content). The photoresist solution is filtered through a Teflon membrane filter having a pore size of 0.2 μm and is spin-coated onto a silicon wafer in such a way that, after drying at 130° C. for 60 seconds on a hotplate, a film having a thickness of 0.63 μm is obtained. Exposure is carried out on a 5:1 projection exposure unit (Canon FPA 4500, NA=0.37) with KrF excimer laser radiation (248 nm) in 1 mJ/cm$^2$ steps. Drying of the wafer is then completed on the hotplate for 60 seconds and the wafer is developed for 90 seconds in a 0.131N tetramethylammonium hydroxide solution customarily used for this process. At an exposure dose of 12 mJ/cm$^2$, accurately reproduced positive subsemimicron structures having vertical profiles are obtained, with 0.5 μm lines being resolved. Application Example 3:

84.6 parts by weight of the polymer prepared in Synthesis Example 8 ($M_w$=8,000, $M_w/M_n$=7), 10 parts by weight of 4,4', 4", 4'"-tetrakis(1,5-pentanediyl-3-ylidene)phenol, 5.0 parts by weight of triphenylsulfonium triflate and 0.4 part by weight of 4,4'-diaminodiphenyl ether are dissolved in methyl 3-methoxypropionate (19.0% solids content). The photoresist solution is filtered through a Teflon membrane filter having a pore size of 0.2 μm and is spin-coated onto a silicon wafer in such a way that, after drying at 130° C. for 60 seconds on a hotplate, a film having a thickness of 0.72 μm is obtained.

Exposure is carried out on a 5:1 projection exposure unit (Canon FPA 4500, NA=0.37) with KrF excimer laser radiation (248 nm) in 1 mJ/cm$^2$ steps. Drying of the wafer is then completed on the hotplate for 60 seconds and the wafer is developed for 90 seconds in a 0.131N tetramethylammonium hydroxide solution customarily used for this process. At an exposure dose of 10 mJ/cm$^2$, accurately reproduced positive subsemimicron structures having vertical profiles are obtained, with 0.45 μm lines being resolved.

Application Example 4:

96.85 parts by weight of the polymer prepared in Synthesis Example 9, 5 parts by weight of 2-nitro-6-(trifluoromethyl)benzyl 4-methoxybenzenesulfonate and 0.45 part by weight of 2,4,5-triphenylimidazole are dissolved in 354 parts by weight of 1-methoxy-2-propyl acetate. The solution is filtered through a filter having a pore diameter of 0.2 μm and is spin-coated onto a silicon wafer in such a way that, after predrying at 130° C. on a hotplate for 60 s, a film having a thickness of 0.763 μm is obtained. Exposure is carried out with a 5:1 projection exposure unit (Canon FPA 4500, NA 0.37) with KrF excimer laser radiation (248 nm) through a dark-field mask in steps of 2 mJ/cm$^2$. Drying of the wafer is then completed on the hotplate at 110° C. for 60 s, and the wafer is subsequently developed for 60 s in commercial 0.262N tetramethylammonium hydroxide solution. At an exposure dose of 40 mJ/cm$^2$, accurately reproduced positive subsemimicron structures having vertical profiles are obtained, with 0.31 μm lines being resolved.

Application Example 5:

The photoresist solution from Application Example 4 is processed under analogous cleanroom conditions. In contrast to Application Example 4, however, the process sequence between exposure and subsequent drying-to-completion step is interrupted for 8 h (post-exposure delay of 8 hours).

As described in Example 4, the profiles of the developed structures are vertical and show no T-shaped deformations (no "capping"). The alteration in structure width (line width shrinkage) during this time is less than the customary processing tolerance of 10% of the nominal line width.

Application Example 6:

98.85 parts by weight of the polymer prepared in Synthesis Example 10, 1.0 part by weight of triphenylsulfonium triflate and 0.15 part by weight of 2,4,5-triphenylimidazole are dissolved in 1-methoxy-2-propyl acetate (22% solids content).

The solution is filtered through a filter having a pore diameter of 0.2 μm and is spin-coated onto a silicon wafer in such a way that, after predrying at 130° C. on a hotplate for 60 s, a film having a thickness of 0.785 μm is obtained. Exposure is carried out with a 5:1 projection exposure unit (Canon FPA 4500, NA 0.37) with KrF excimer laser radiation (248 nm) through a dark-field mask in steps of 3 mJ/cm$^2$. Drying of the wafer is then completed on the hotplate at 110° C. for 60 s, and the wafer is subsequently developed for 60 s in commercial 0.262N tetramethylammonium hydroxide solution.

At an exposure dose of 30 mJcm$^2$, accurately reproduced positive subsemimicron structures having vertical profiles are obtained, with 0.30 μm lines being resolved.

Application Example 7:

The wafer from Application Example 6, structured after development, is dried to completion on a hotplate at 140° C. for 150 s. In the case of both 50 μm structures and sub-semimicron images, no thermal deformations are observed in the scanning electron microscope.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A polymer that is insoluble in an aqueous-alkaline developer solution and soluble in organic solvents used for coating resists onto semiconductor substrates comprising:

a plurality of polymer main chains linked together by bridge members, said polymer main chains comprising, in side chains, COOH groups or phenolic hydroxyl groups which are completely or partially substituted with acid-cleavable protecting groups;

said bridge members comprising structural units of formula (I):

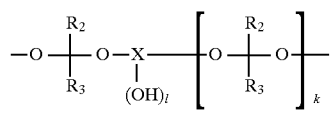

wherein $R_2$ is hydrogen, $C_1$–$C_{18}$ alkyl, $C_5$–$C_{10}$ cycloalkyl, $C_5$–$C_{14}$ aryl or $C_6$–$C_{30}$ aralkyl;

wherein $R_3$ is $C_1$–$C_{18}$ alkyl, $C_5$–$C_{10}$ cycloalkyl, $C_5$–$C_{14}$ aryl or $C_6$–$C_{30}$ aralkyl; said alkyl, cycloalkyl, aryl and aralkyl groups of $R_2$ and $R_3$ being optionally substituted with one or more hydroxyl groups, one or more nitro groups, one or more halogen atoms or combinations thereof;

wherein X is a k+1 valent organic radical;

wherein k is a number from 1 to 5;

wherein l is a number from 0 to 4; and wherein said polymer, upon reaction with an acid, forms one or more cleavage products that are soluble in an aqueous-alkaline developer solution.

2. A polymer according to claim 1, wherein $R_2$ is methyl or ethyl and $R_3$ is hydrogen.

3. A polymer according to claim 1, wherein X is ethylene, isopropylidene, cyclohexylene, or the divalent or polyvalent radical of a polyhydroxy compound of the formulae (IIa–IIj) following the removal of two or more OH groups:

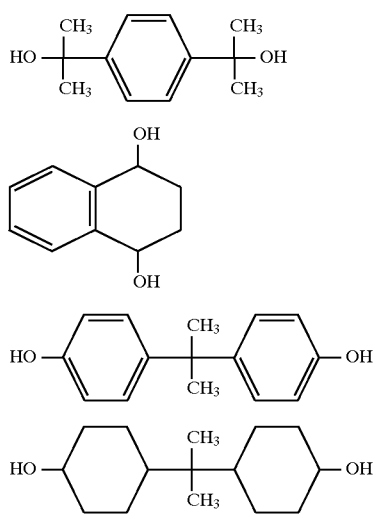

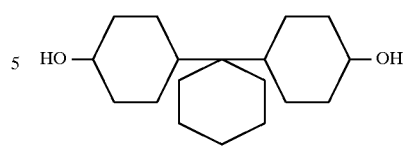

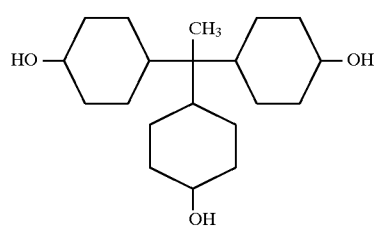

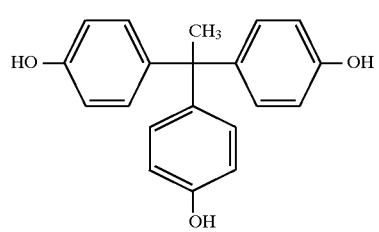

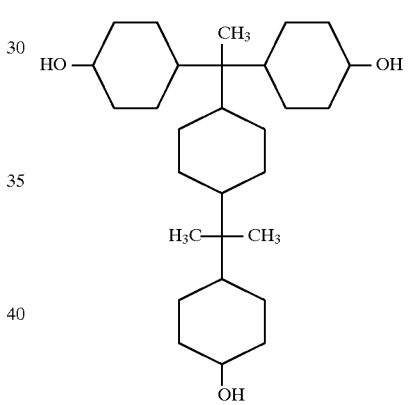

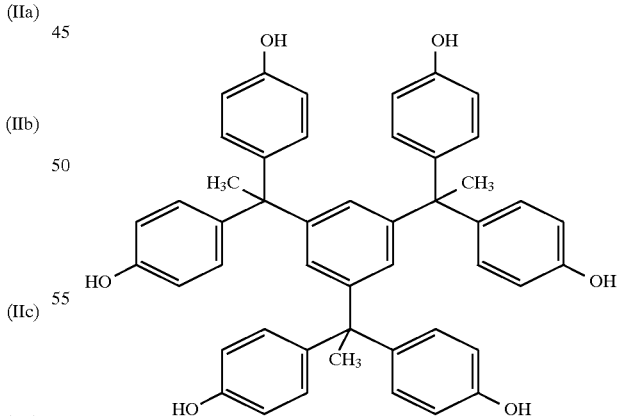

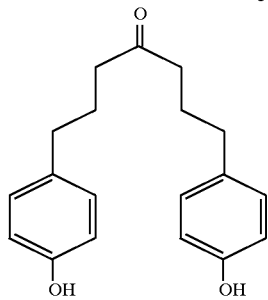
(IIj)

4. A polymer according to claim 1, which comprises as acid-cleavable protecting group a group of the formula (II):

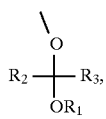
(II)

in which $R_2$ and $R_3$ are as defined for formula (I) according to claim 1 and $R_1$ is $C_1$–$C_{18}$ alkyl, $C_5$–$C_{10}$ cycloalkyl, $C_5$–$C_{14}$ aryl or $C_6$–$C_{30}$ aralkyl, it being possible for the alkyl, cycloalkyl, aryl, or aralkyl groups to be substituted if desired by one or more hydroxyl groups or nitro groups or by one or more halogen atoms.

5. A polymer according to claim 1 having a protecting-group content $S = m/(m+n)$ of from 0.05 to 0.95 and a degree of cross-linking $V = o/(m+n+o)$ of from 0.001 to 0.2, m being the number of acid-cleavable protecting groups, n being the sum of the number of COOH groups and the number of phenolic hydroxyl groups, and o being the number of bridge members of the formula (I).

6. A polymer according to claim 5, wherein the protecting-group content S is from 0.07 to 0.65.

7. A polymer according to claim 1, comprising structural repeating units of the formulae (III), (IV), and (V):

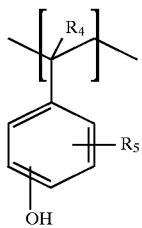
(III)

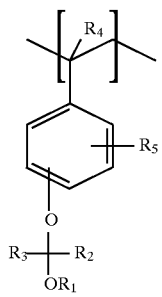
(IV)

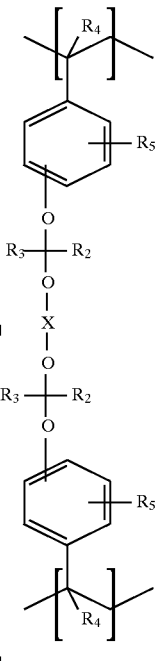
(V)

in which $R_2$, $R_3$, k and X are as defined in claim 1, $R_1$ is as defined in formula (II) according to claim 5, $R_4$ is hydrogen, methyl or halogen and $R_5$ is hydrogen, $C_1$–$C_6$ alkyl, $C_1$–$C_6$ alkoxy or halogen.

8. A polymer according to claim 1, comprising structural repeating units of the formulae (IIIa), (IVa), and (Va):

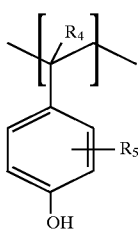
(IIIa)

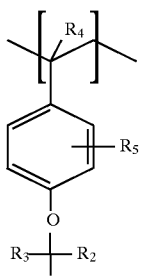
(IVa)

-continued

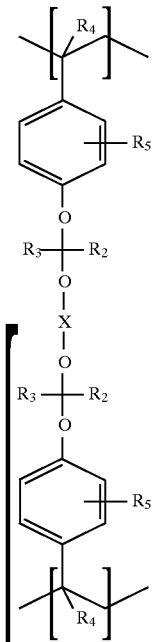
(Va)

in which $R_2$, $R_3$, k and X are as defined in claim 1, $R_1$ is as defined in formula (II) according to claim 5, $R_4$ is hydrogen, methyl or halogen and $R_5$ is hydrogen, $C_1$–$C_6$ alkyl, $C_1$–$C_6$ alkoxy or halogen.

9. A polymer according to claim 4, comprising protecting groups of the formula (II) in which $R_1$ is methyl, ethyl, n-propyl, isopropyl, n-butyl, isobutyl, tert-butyl, or cyclohexyl.

10. A polymer according to claim 4, comprising protecting groups of the formula (II) and bridge members of the formula (I) in which $R_2$ is methyl or ethyl and $R_3$ is hydrogen.

11. A polymer according to claim 7, comprising structural repeating units of the formulae (III), (IV), and (V) in which $R_4$ and $R_5$ are hydrogen.

12. A process for the preparation of a polymer according to claim 1 by reacting a polymer comprising, in the side chains, COOH groups or phenolic hydroxyl groups with a vinyl ether of the formula (VI):

(VI)

in which $R_1$ and $R_3$ are as defined for formula (II) according to claim 5 and $R_6$ is hydrogen, $C_1$–$C_{17}$ alkyl, $C_5$–$C_{10}$ cycloalkyl, $C_5$–$C_{14}$ aryl or $C_6$–$C_{30}$ aralkyl, with a polyhydroxy compound of the formula (VII):

(VII), in which X and k are as defined for formula (I) according to claim 1.

13. A radiation-sensitive composition comprising, based on the overall quantity of components A and B, (A) 70.0–99.9% by weight of a polymer according to claim 1, and (B) 0.1–30.0% by weight of a substance which forms an acid on exposure to actinic radiation.

14. A radiation-sensitive composition according to claim 13, comprising as component B an onium salt, a disulfone compound or a nitrobenzyl sulfonate.

15. A radiation-sensitive composition according to claim 13, comprising not only components A and B but also an organic solvent as component C.

16. A radiation-sensitive composition according to claim 13, comprising not only components A and B but also an N-containing heterocyclic compound or an aromatic amine in addition as component D.

17. A process for the production of positive images by:

(I.) coating of a substrate with a radiation-sensitive composition according to claim 13, (II.) exposure of the coated substrate to actinic radiation in a predetermined pattern, and (III.) development of the exposed substrate with a developer for positive-working resists.

\* \* \* \* \*